(12) United States Patent
Preusse et al.

(10) Patent No.: US 9,620,453 B2
(45) Date of Patent: Apr. 11, 2017

(54) SEMICONDUCTOR STRUCTURE INCLUDING A LAYER OF A FIRST METAL BETWEEN A DIFFUSION BARRIER LAYER AND A SECOND METAL AND METHOD FOR THE FORMATION THEREOF

(71) Applicant: GLOBALFOUNDRIES Inc., Grand Cayman (KY)

(72) Inventors: Axel Preusse, Radebeul (DE); Romy Liske, Dresden (DE); Marcus Wislicenus, Muegeln OT Niedergosein (DE); Robert Krause, Dresden (DE); Lukas Gerlich, Dresden (DE); Benjamin Uhlig, Dresden (DE); Sascha Bott, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 214 days.

(21) Appl. No.: 14/512,850

(22) Filed: Oct. 13, 2014

(65) Prior Publication Data
US 2016/0104638 A1    Apr. 14, 2016

(51) Int. Cl.
| | |
|---|---|
| *H01L 23/532* | (2006.01) |
| *H01L 21/768* | (2006.01) |
| *H01L 21/285* | (2006.01) |
| *H01L 21/288* | (2006.01) |
| *C25D 7/12* | (2006.01) |
| *C23C 18/16* | (2006.01) |

(Continued)

(52) U.S. Cl.
CPC .... *H01L 23/53252* (2013.01); *C23C 18/1653* (2013.01); *C23C 18/54* (2013.01); *C25D 7/123* (2013.01); *H01L 21/288* (2013.01); *H01L 21/2885* (2013.01); *H01L 21/28556* (2013.01); *H01L 21/76843* (2013.01); *H01L 21/76873* (2013.01); *H01L 21/76874* (2013.01); *H01L 21/76877* (2013.01); *H01L 23/53238* (2013.01); *C25D 3/38* (2013.01); *H01L 2924/0002* (2013.01)

(58) Field of Classification Search
USPC .......................................... 438/627; 257/751
See application file for complete search history.

(56) References Cited

U.S. PATENT DOCUMENTS

| | | | |
|---|---|---|---|
| 6,509,267 B1 * | 1/2003 | Woo ................. | H01L 21/76801 257/E21.576 |
| 7,538,434 B2 * | 5/2009 | Shih ................. | H01L 23/53238 257/40 |

(Continued)

*Primary Examiner* — Telly Green
(74) *Attorney, Agent, or Firm* — Amerson Law Firm, PLLC

(57) ABSTRACT

A method includes providing a semiconductor structure including a recess. The recess includes at least one of a contact via and a trench. A layer of a first metal is deposited over the semiconductor structure. An electroless deposition process is performed. The electroless deposition process removes a first portion of the layer of first metal from the semiconductor structure and deposits a first layer of a second metal over the semiconductor structure. An electroplating process is performed. The electroplating process deposits a second layer of the second metal over the first layer of second metal. A second portion of the layer of first metal remains in the semiconductor structure.

24 Claims, 7 Drawing Sheets

(51) Int. Cl.
*C23C 18/54* (2006.01)
*C25D 3/38* (2006.01)

(56) References Cited

U.S. PATENT DOCUMENTS

| | | | | |
|---|---|---|---|---|
| 8,963,415 | B2* | 2/2015 | Sugano | H01L 51/5203 257/40 |
| 2002/0111013 | A1* | 8/2002 | Okada | H01L 21/76802 438/627 |
| 2005/0006222 | A1* | 1/2005 | Ding | C23C 14/358 204/192.1 |
| 2006/0202346 | A1* | 9/2006 | Shih | H01L 23/53238 257/774 |
| 2009/0088511 | A1* | 4/2009 | Konno | C08G 65/327 524/440 |
| 2009/0280649 | A1* | 11/2009 | Mayer | B23H 5/08 438/676 |
| 2010/0246152 | A1* | 9/2010 | Lin | H01L 21/563 361/783 |

* cited by examiner

SEMICONDUCTOR STRUCTURE INCLUDING A LAYER OF A FIRST METAL BETWEEN A DIFFUSION BARRIER LAYER AND A SECOND METAL AND METHOD FOR THE FORMATION THEREOF

BACKGROUND OF THE INVENTION

1. Field of the Invention

Generally, the present disclosure relates to the field of integrated circuits, and, in particular, to integrated circuits wherein a damascene technique is employed for forming electrical connections between circuit elements.

2. Description of the Related Art

Integrated circuits include a number of individual circuit elements such as, for example, transistors, capacitors, diodes and resistors, which are interconnected by means of electrically conductive lines. The electrically conductive lines may be formed of metal including copper, such as substantially pure copper or a copper alloy. For forming the electrically conductive lines, damascene techniques may be employed.

In damascene techniques, trenches and contact vias are formed in an interlayer dielectric, which may include silicon dioxide and/or a low-k material having a smaller dielectric constant than silicon dioxide. In the trenches and contact vias, a diffusion barrier layer may be formed. After the formation of the diffusion barrier layer, the trenches and contact vias may be filled with the metal including copper. This may be done by means of electroplating for depositing the metal and chemical mechanical polishing for removing portions of the metal deposited outside the trenches and contact vias.

The diffusion barrier layer may help to substantially avoid or at least reduce a diffusion of copper from the metal into the interlayer dielectric and/or other portions of the semiconductor structure, which might adversely affect the functionality of the integrated circuit.

Issues that can occur in the above-described damascene process may include a formation of voids in the trenches and/or contact vias. The presence of voids in electrically conductive lines may increase the likelihood of electromigration occurring. Electromigration may further increase the size of voids, which may finally lead to a failure of the electrical connection provided by the electrically conductive lines.

Further issues that can occur in the above-described damascene process may include a relatively low adhesion between the diffusion barrier layer and the metal.

In view of the situation described above, the present disclosure provides methods which may allow a reduction of the likelihood of voids in contact vias and/or trenches filled with a metal occurring and/or wherein an improved adhesion between the metal and a diffusion barrier layer is provided. Moreover, the present disclosure provides devices having an improved adhesion between a metal in a contact via and/or trench and a diffusion barrier layer.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method disclosed herein includes providing a semiconductor structure including a recess. The recess includes at least one of a contact via and a trench. A layer of a first metal is deposited over the semiconductor structure. An electroless deposition process is performed. The electroless deposition process removes a first portion of the layer of first metal from the semiconductor structure and deposits a first layer of a second metal over the semiconductor structure. An electroplating process is performed. The electroplating process deposits a second layer of the second metal over the first layer of the second metal. A second portion of the layer of first metal remains in the semiconductor structure.

An illustrative device disclosed herein includes a semiconductor substrate and an interlayer dielectric above the substrate. In the interlayer dielectric, a recess including at least one of a contact via and a trench is provided. A diffusion barrier layer is formed over a bottom surface and a sidewall surface of the recess. A layer of a first metal is formed over the diffusion barrier layer. A second metal is formed over the layer of first metal. A standard redox potential of the first metal is greater than a standard redox potential of the second metal.

BRIEF DESCRIPTION OF THE DRAWINGS

The disclosure may be understood by reference to the following description taken in conjunction with the accompanying drawings, in which like reference numerals identify like elements, and in which.

Figure 1:
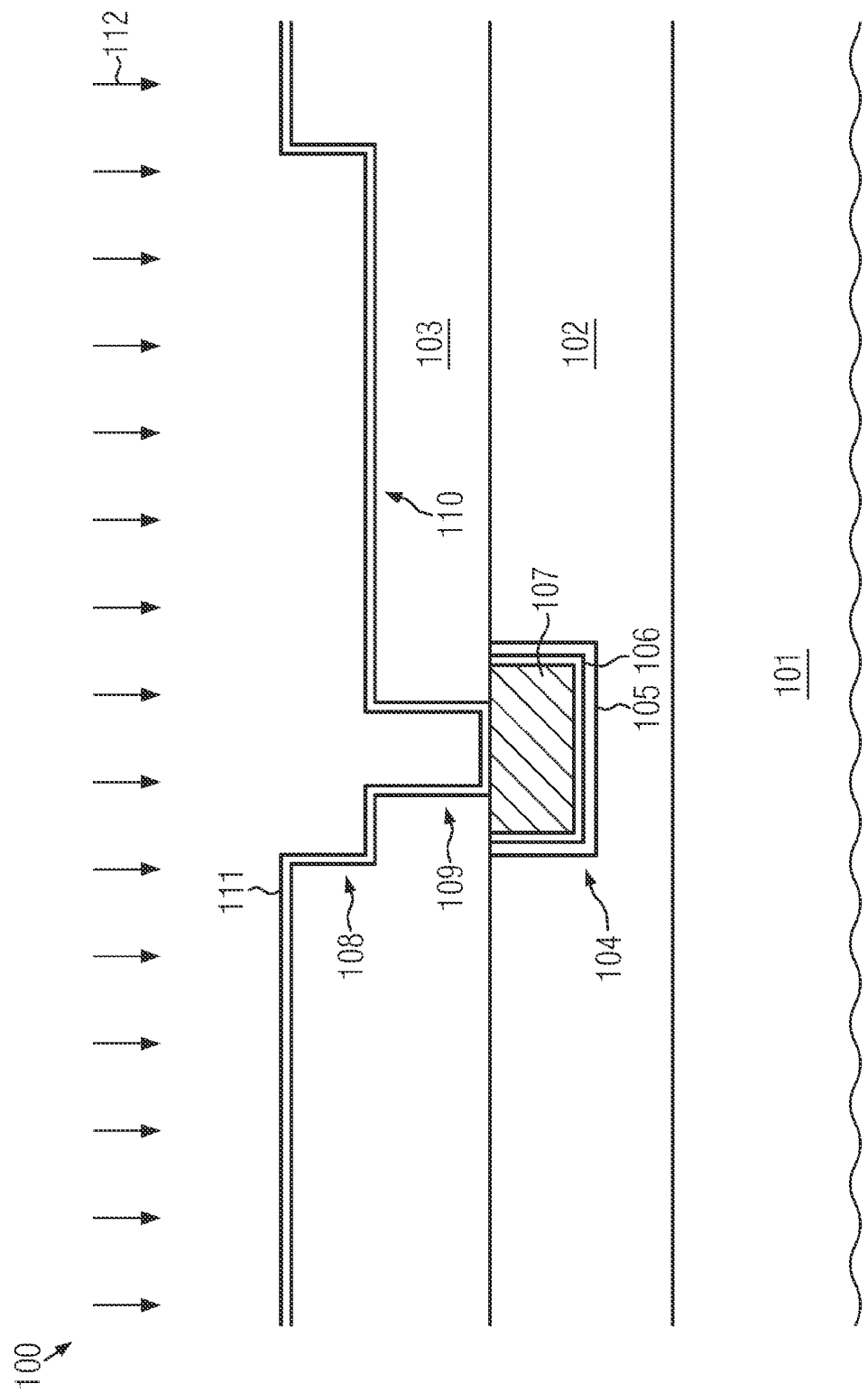
FIGS. 1-5 show schematic cross-sectional views of a semiconductor structure according to an embodiment in a stage of a manufacturing process according to an embodiment.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Further embodiments will be described with reference to the drawings. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the releva No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

FIG. 1 shows a schematic cross-sectional view of a semiconductor structure 100 according to an embodiment in a stage of a manufacturing process according to an embodiment. The semiconductor structure 100 may include a semiconductor substrate 101. The substrate 101 may include a bulk semiconductor substrate such as, for example, a silicon wafer. In other embodiments, the substrate 101 may include a semiconductor-on-insulator (SOI) substrate that includes a layer of semiconductor material such as, for example, silicon that is formed over a layer of an electrically insulating material such as, for example, silicon dioxide. The layer of electrically insulating material may be provided over a support wafer, which may be a silicon wafer.

The semiconductor structure 100 may further include an interlayer dielectric 102 that is provided over the substrate 101.

The substrate 101 may include circuit elements such as transistors, capacitors, diodes and resistors, which may be formed at a side of the substrate 101 which, in the view of FIG. 1, is an upper side of the substrate 101.

The interlayer dielectric 102 may include an electrically insulating material such as, for example, silicon dioxide and/or a low-k interlayer dielectric having a smaller dielectric constant than silicon dioxide, such as, for example, a fluorosilicate glass, a carbon-doped silicon dioxide, a porous silicon dioxide, a porous carbon-doped silicon dioxide, a hydrogen silsesquioxane, a methylsilsesquioxane, a polyimide, a polynorbornene, benzocyclobutene and/or a polytetrafluoroethylene.

The interlayer dielectric 102 need not be provided directly on the substrate 101. Further layers of interlayer dielectric, which may include trenches and/or contact vias filled with a metal, may be provided below the interlayer dielectric 102. Furthermore, contact vias filled with an electrically conductive material (not shown) may be provided in the interlayer dielectric 102 for providing an electrical connection between the second metal 107 in the trench 104 and electrically conductive features in lower interconnect levels and/or circuit elements formed at the substrate 101.

In the interlayer dielectric 102, a trench 104 may be provided. In the trench 104, a diffusion barrier layer 105 and a layer 106 of a first metal may be provided. The diffusion barrier layer 105 may be formed over a bottom surface of the trench 104 and over sidewall surfaces of the trench 104, as shown in FIG. 1. The diffusion barrier layer 105 may be formed of a conventional diffusion barrier layer material such as, for example, tantalum nitride. Further features of the diffusion barrier layer 105 may correspond to those of known diffusion barrier layers that are provided in semiconductor structures between electrically conductive lines including copper and an interlayer dielectric for substantially preventing a diffusion of copper and oxygen. The layer 106 of first metal may be provided over the diffusion barrier layer 105. Similar to the diffusion barrier layer 105, the layer 106 of first metal may be provided at a bottom surface and at sidewall surfaces of the trench 104, as shown in FIG. 1. Furthermore, the semiconductor structure 100 may include a second metal 107 that is formed over the layer 106 of first metal and fills the trench 104.

The first metal 106 and the second metal 107 may be different metals. A standard redox potential of the second metal 107 may be greater than a standard redox potential of the first metal 106 so that the second metal 107 is more noble than the first metal 106. In some embodiments, the first metal 106 may include cobalt, and the second metal 107 may include copper, silver, gold, platinum or nickel or an alloy thereof including two or more of these metals.

The standard redox potential of a particular metal may be measured in accordance with well-known techniques. In particular, an electrode formed of the metal may be inserted into a solution including ions of the metal under standard conditions, which may include a temperature of approximately 25° C., a pressure of approximately 101.3 kPa and ion activities of approximately 1. Furthermore, a standard hydrogen electrode may be provided, and the standard redox potential of the metal may be determined by measuring a voltage between the electrode of the metal and the standard hydrogen electrode when the solution including the ions of the metal and the electrolyte of the standard hydrogen electrode are connected to each other by a salt bridge. Alternatively, another standard electrode may be used instead of a standard hydrogen electrode, such as, for example, a silver chloride electrode or a saturated calomel electrode, and an appropriate conversion of the measured potential difference may be performed.

In some embodiments, the first metal of the layer 106 may include a dopant such as, for example, nitrogen, as will be explained in more detail below.

The semiconductor structure 100 may further include an interlayer dielectric 103 that is provided over the interlayer dielectric 102. In some embodiments, the interlayer dielectrics 102, 103 may be formed of substantially the same material.

In some embodiments, a capping layer, for example a layer of silicon nitride, may be formed between the interlayer dielectrics 102, 103 and/or between the materials of the diffusion barrier layer 105, the layer 106 of first metal and the second metal 107 in the trench 104, on the one hand, and the interlayer dielectric 103, on the other hand.

In the interlayer dielectric 103, a recess 108 including a trench 110 and a contact via 109 may be provided. The contact via 109 may be provided over the second metal 107 in the trench 104 and may extend through the interlayer dielectric 103 and, if a capping layer is present on the second metal 107, through the capping layer so that the second metal 107 in the trench 104 is exposed at the bottom of the contact via 109.

The substrate 101, and circuit elements formed at the substrate 101, may be manufactured using known techniques of semiconductor processing. The interlayer dielectric 102 may be formed by means of deposition processes such as chemical vapor deposition, plasma enhanced chemical vapor deposition and/or spin coating, and the trench 104 as well as contact vias in the interlayer dielectric 102 may be formed by means of techniques of photolithography and etching. For providing the diffusion barrier layer 105, the layer 106 of first metal and the second metal 107 in the trench 104, techniques corresponding to those employed for providing corresponding elements in the recess 108 that will be detailed below may be used.

The interlayer dielectric 103 may be formed by means of deposition techniques such as chemical vapor deposition, plasma enhanced chemical vapor deposition and/or spin coating, and the contact via 109 and the trench 110 of the recess 108 may be formed by means of techniques of photolithography and etching.

After the formation of the recess 108, a diffusion barrier layer 111 may be deposited over the semiconductor structure 100. The diffusion barrier layer 111 may be adapted to substantially prevent a diffusion of a metal that will be provided in the recess 108 in later stages of the manufacturing process through the diffusion barrier layer. In particular, the diffusion barrier layer 111 may be adapted to substantially prevent a diffusion of copper, silver, gold, platinum and/or nickel.

In some embodiments, the diffusion barrier layer 111 may include a conventional diffusion barrier layer material such as, for example, tantalum nitride, and it may be formed by means of deposition techniques conventionally employed in the formation of diffusion barrier layers, such as ionized physical vapor deposition (iPVD), chemical vapor deposition (CVD) or atomic layer deposition (ALD). A thickness of the diffusion barrier layer 111 may be in a range from about 1-50 nm and/or in a range from about 1-10 nm. In FIG. 1, a deposition process employed for the formation of the diffusion barrier layer 111 is schematically denoted by arrows 112.

Figure 2:
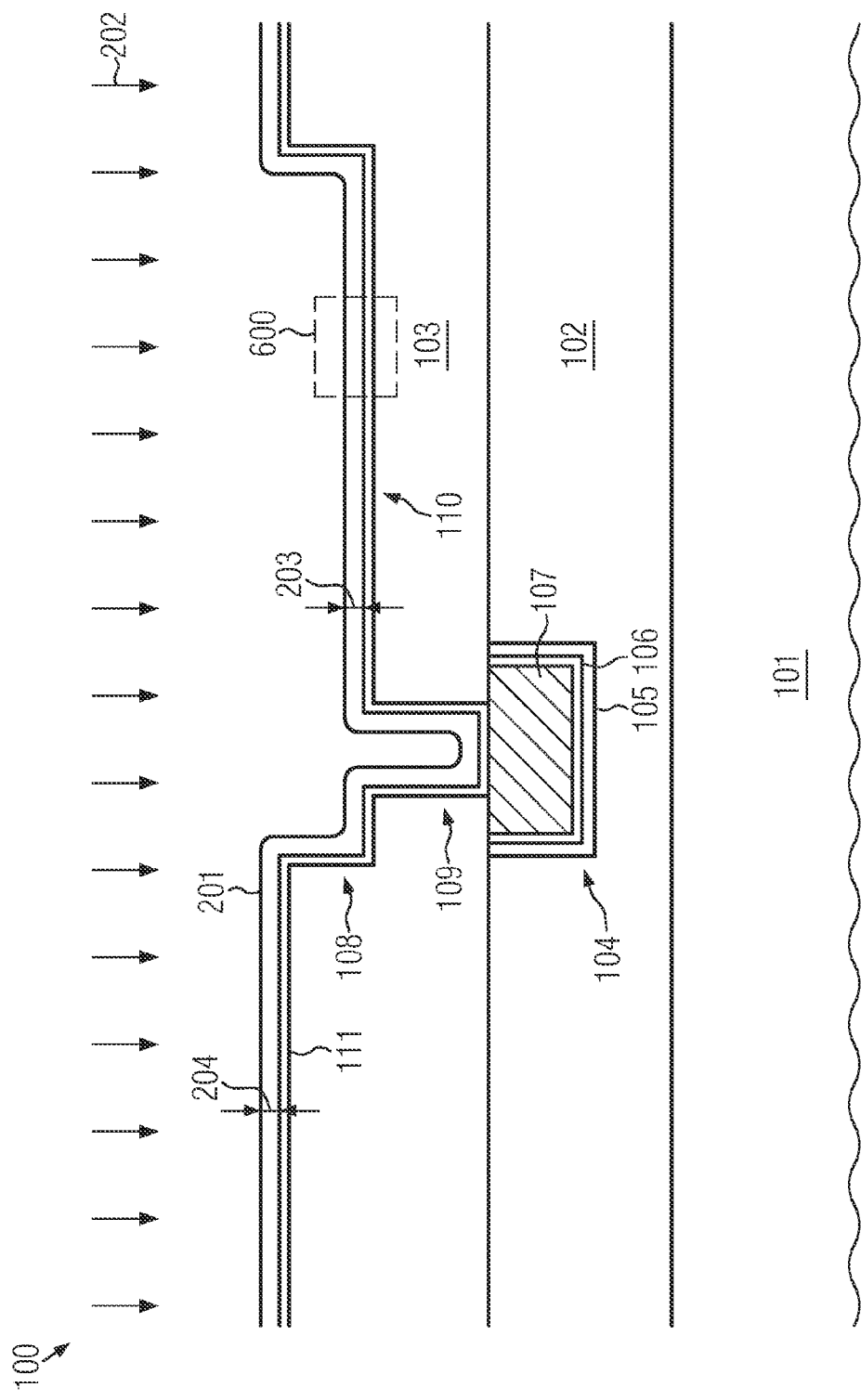

FIG. 2 shows a schematic cross-sectional view of the semiconductor structure 100 in a later stage of the manufacturing process. After the formation of the diffusion barrier layer 111, a layer 201 of the first metal may be deposited over the semiconductor structure 100. In FIG. 2, a deposition process employed for the deposition of the layer 201 of first metal is schematically denoted by arrows 202.

The first metal in the layer 201 may be substantially the same metal as the first metal in the layer 106. In particular, the layer 201 of first metal may include cobalt.

In some embodiments, the deposition process 202 that is employed for depositing the layer 201 of first metal may be a chemical vapor deposition process. In the chemical vapor deposition process, the semiconductor structure 100 may be provided in a chemical vapor deposition reactor to which a flow of a process gas is supplied. The process gas may include a precursor and a carrier gas.

The precursor may be a chemical compound, for example, an organometallic compound that includes the first metal of the layer 201. In embodiments wherein the layer 201 of first metal includes cobalt, the precursor may include CCTBA (dicobalt hexacarbonyl tert-butylacetylene) or Co(AMD)2 (bis(N,N'-diisopropylacetamidinato)cobalt). The carrier gas may include argon, helium or nitrogen. A flow of the process gas may be in a range from about 50-4000 sccm for typical 200 mm and 300 mm CVD reactors. During the chemical vapor deposition process, the semiconductor structure 100 may be maintained at a deposition temperature which may be in a range from about 100-300° C. A process pressure may be maintained in a range from about 2-40 Torr.

In some embodiments, the deposition process 202 that is used for the deposition of the layer 201 of the first metal may be a substantially conformal chemical vapor deposition process. When a substantially conformal chemical vapor deposition process is employed for the formation of the layer 201 of the first metal, a thickness 203 of the layer 201 of the first metal that is obtained in the recess 108 may be approximately equal to a thickness 204 of the layer 201 of first metal that is obtained in areas of the semiconductor structure 100 outside the recess 108.

In some embodiments, a substantially conformal chemical vapor deposition of cobalt may be obtained by using a process gas flow in a range from about 300-1000 sccm, a deposition temperature in a range from about 125-225° C. and a pressure in a range from about 5-15 Torr. The present disclosure is not limited to embodiments wherein the deposition process 202 that is used for the deposition of the layer 201 of the first metal is a chemical vapor deposition process. In other embodiments, other deposition techniques, such as, for example, atomic layer deposition, may be employed.

The thickness 203, 204 of the layer 201 of the first metal may be in a range from about 1-100 nm and/or in a range from about 5-40 nm. The layer 201 of first metal may have a thickness equal to or greater than a thickness of the layer 301 of second metal, the formation of which will be described below with reference to FIG. 3.

In other embodiments, the layer 201 of first metal may include a dopant. In some of these embodiments, the dopant may include nitrogen.

Figure 6:
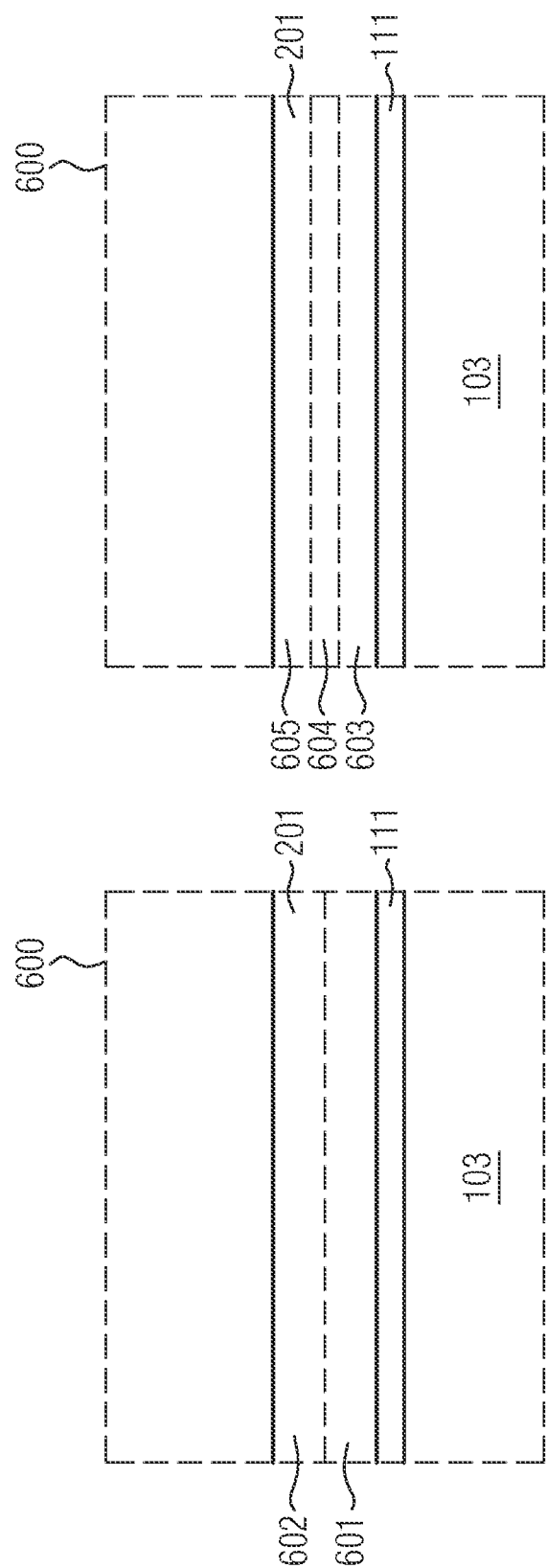
FIGS. 6A and 6B show schematic cross-sectional views of portions of the semiconductor structure illustrated in FIG. 2.

FIG. 6A shows a schematic cross-sectional view of a portion 600 of the semiconductor structure 100 that illustrates a dopant distribution in the layer 201 of first metal that may be provided in embodiments. The layer 201 of first metal may include a lower portion 601 that is arranged adjacent to the diffusion barrier layer 111 and an upper portion 602 that is provided over the lower portion 601, the lower portion 601 being arranged between the diffusion barrier layer 111 and the upper portion 602. A dopant concentration in the lower portion 601 of the layer 201 of first metal may be greater than a dopant concentration in the upper portion 602 of the layer 201 of first metal.

In other embodiments, which will be described in the following with reference to FIG. 6B, a different dopant distribution in the layer 201 of first metal may be provided. FIG. 6B shows a schematic cross-sectional view of the portion 600 of the semiconductor structure in accordance with other embodiments. The layer 201 of first metal may include a lower portion 603 that is provided adjacent the diffusion barrier layer 111, a central portion 604 that is provided over the lower portion 603, and an upper portion 605 that is provided over the central portion 604. The central portion 604, which is arranged between the lower portion 603 and the upper portion 605 of the layer 201 of first metal, may have a greater dopant concentration than the lower portion 603 and the upper portion 605.

The presence of dopants such as nitrogen in the layer 201 of first metal may reduce a rate at which the first metal of the layer 201 is replaced with a second metal in an electroless deposition process that will be described in more detail below with reference to FIG. 3. Thus, the lower portion 601 of the layer 201 of first metal in embodiments as illustrated in FIG. 6A or the central portion 604 of the layer 201 of first metal in embodiments as illustrated in FIG. 6B may be used as a stop layer in the electroless deposition process.

The concentration of dopants in the layer 201 of first metal may be controlled by varying a supply of dopant and/or a chemical compound including the dopant during the deposition process 202 that is employed for forming the layer 201 of first metal.

Figure 3:
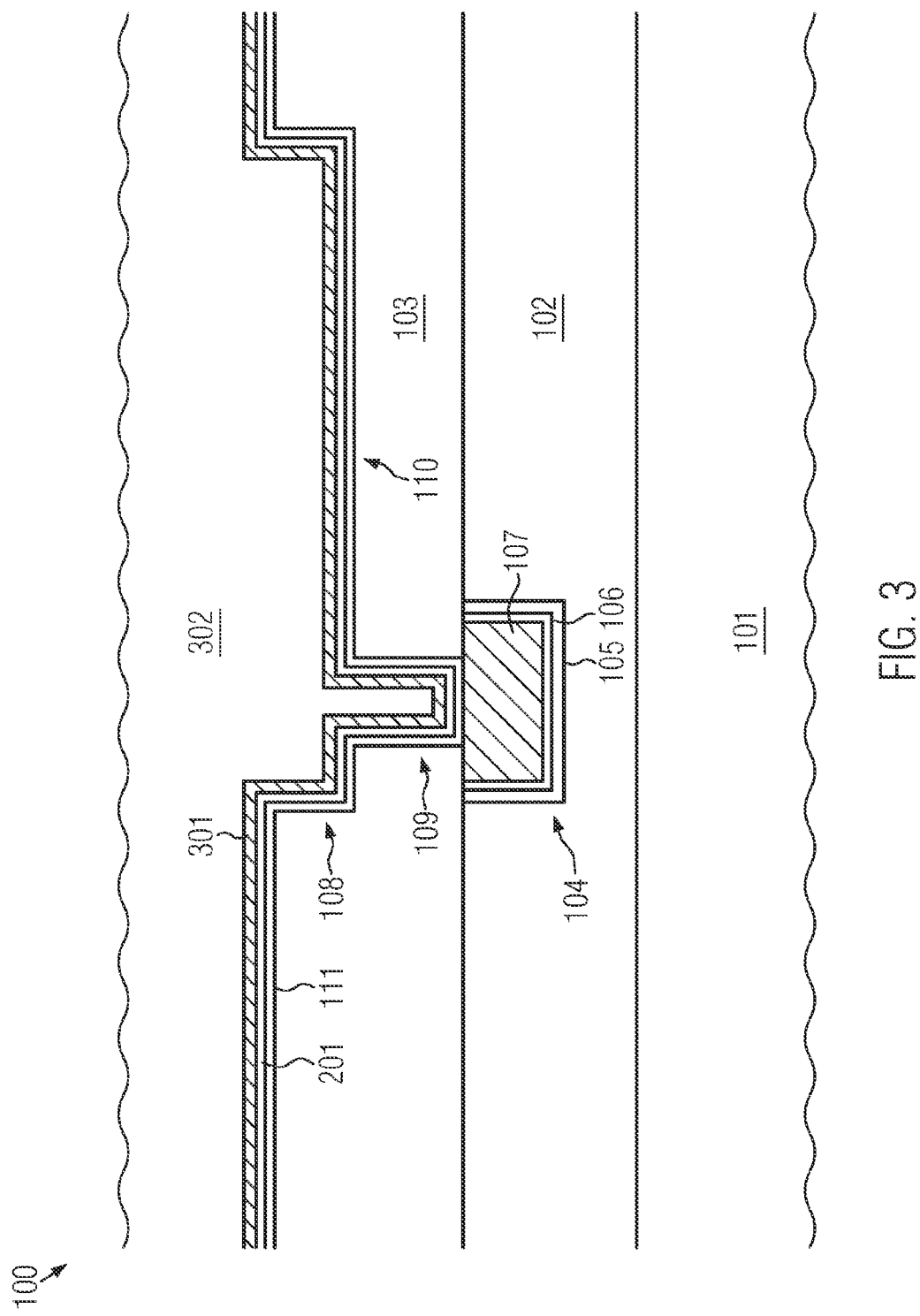

FIG. 3 shows a schematic cross-sectional view of the semiconductor structure 100 in a later stage of the manufacturing process. After the deposition of the layer 201 of first metal over the semiconductor structure 100, an electroless deposition process may be performed. For performing the electroless deposition process, the semiconductor structure 100 may be brought into contact with an electrolyte 302. The electrolyte 302 may be an aqueous solution that includes a salt of a second metal, wherein a redox potential of the redox pair formed by the first metal of the layer 201 and ions of the first metal in the electrolyte 302 is smaller than a redox potential of the redox pair formed by the second metal and ions of the second metal in the electrolyte. In some embodiments, a standard redox potential of the first metal may also be smaller than a standard redox potential of the second metal.

In the following, for convenience, the redox potentials of the redox pairs formed by the first metal and the ions of the first metal and the redox pair formed by the second metal and the ions of the second metal will be denoted as redox potentials of the first and second metal, respectively.

The redox potentials of the first and second metals in the electrolyte 302 may deviate from their standard redox potential to a certain extent since the concentrations and/or activities of ions of the first and second metal and the temperature of the electrolyte may deviate from standard conditions to a certain extent. However, in some embodiments, the deviations between the redox potentials of the first and second metal and their standard redox potentials may be relatively small so that a redox potential of the second metal in the electrolyte 302 is typically greater than the redox potential of the first metal in the electrolyte 302 if the standard redox potential of the second metal is greater than the standard redox potential of the first metal.

In embodiments wherein the first metal of the layer 201 includes cobalt, the electrolyte 302 may include one or more salts of at least one of copper, silver, gold, platinum and nickel. Additionally, the electrolyte 302 may include an acid. Furthermore, the electrolyte 302 may include additives, wherein the additives may include an accelerator, a suppressor, a leveler and a chloride.

In embodiments wherein the second metal includes copper, the electrolyte 302 may be an aqueous solution of sulfuric acid and copper sulfate pentahydrate. A sulfuric acid content of the electrolyte 302 may be in a range from about 10-200 g/l, and a copper content of the electrolyte 302 may be in a range from about 1-60 g/l. The electrolyte may be maintained between approximately 10-40° C.

Additives in the electrolyte 302 may be additives conventionally employed in electrolytes that are used in electroplating processes for filling contact vias and/or trenches in semiconductor structures with a metal including copper for performing a damascene process. Examples of accelerators include bis-(3-sulfopropyl)-disulfide (SPS) and 3-mercapto-1-propanesulfonic acid (MPS). Examples of suppressors include polyethylene glycol, and examples of levelers include polyethyleneimine and Janus Green B. A chloride may be provided by adding hydrochloric acid to the electrolyte 302. Concentrations of additives in the electrolyte 302 may be in a range from about 1-1000 ppm and may correspond to additive concentrations conventionally employed in semiconductor processing.

In embodiments wherein the second metal includes silver, gold, platinum and/or nickel, the electrolyte 302 may include salts of silver, gold, platinum and/or nickel that are conventionally employed in electroplating processes for depositing these metals, like gold sulfite, gold cyanide or silver nitrate.

In the electroless deposition process, the first metal of the layer 201 may react chemically with the electrolyte 302, wherein the first metal is oxidized so that ions of the first metal are formed, and ions of the second metal are reduced so that electrically conductive material is formed.

In some embodiments, the layer 201 of first metal may include a thin passivating layer of an oxide of the first metal at its surface. In particular, in embodiments wherein the layer 201 of first metal includes cobalt, a thin layer of cobalt oxide may be present at the surface of the layer 201 of first metal. This oxide may react chemically with sulfuric acid in the electrolyte 302, in accordance with the following equations:

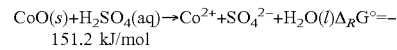
$$CoO(s) + H_2SO_4(aq) \rightarrow Co^{2+} + SO_4^{2-} + H_2O(l) \Delta_R G° = -151.2 \text{ kJ/mol}$$

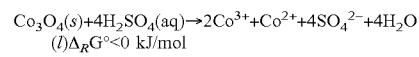
$$Co_3O_4(s) + 4H_2SO_4(aq) \rightarrow 2Co^{3+} + Co^{2+} + 4SO_4^{2-} + 4H_2O(l) \Delta_R G° < 0 \text{ kJ/mol}$$

Once the passivating oxide is removed from the layer 201 of first metal, the first metal may react chemically with ions of the second metal in the electrolyte 302. Since the second metal has a greater redox potential than the first metal, in this chemical reaction, ions of the first metal are formed, and ions of the second metal are reduced so that a layer 301 of the second metal is deposited over the semiconductor structure 100.

In embodiments wherein the first metal is cobalt and the second metal is copper, the formation of the layer 301 may occur in accordance with the following equation:

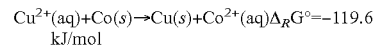
$$Cu^{2+}(aq) + Co(s) \rightarrow Cu(s) + Co^{2+}(aq) \Delta_R G° = -119.6 \text{ kJ/mol}$$

wherein a redox potential of $Cu \rightarrow Cu^{2+} + 2e^-$ is about +0.34 V and a redox potential of $Co \rightarrow Co^{2+} + 2e^-$ is about −0.28 V.

The electroless deposition process is not performed until the entire first metal of the layer 201 is consumed by the chemical reaction. Instead, the electroless deposition process may be stopped before the entire first metal of the layer 201 is consumed by the chemical reaction so that a portion of the layer of first metal having a smaller thickness than the as-deposited layer 201 of the first metal remains in the semiconductor structure 100, as shown in FIG. 3.

The layer 301 of second material may be contiguous or insular. It may have a thickness smaller than the thickness of the as-deposited layer 201 of first metal, and it may include one or more atomic layers of the second metal.

In embodiments wherein the layer 201 of first metal includes a dopant such as nitrogen, the presence of the dopant may lower a rate of the chemical reaction wherein the first metal of the layer 201 is oxidized, and the second metal is deposited on the semiconductor structure 100.

Thus, in embodiments wherein the layer 201 of first metal has a configuration as described above with reference to FIG. 6A, the chemical reaction may slow down or substantially stop when the upper portion 602 of the layer 201 of first metal is consumed by the chemical reaction. The lower portion 601 of the layer 201 of first metal may substantially remain in the semiconductor structure 100.

In embodiments wherein the layer 201 of first metal has a configuration as described above with reference to FIG. 6B, the chemical reaction wherein the first metal is oxidized and the second metal is deposited on the semiconductor structure 100 may slow down or substantially stop as soon as the upper portion 605 of the layer 201 of first metal is removed, and the central portion 604 as well as the lower portion 603 may remain in the semiconductor structure 100.

In some embodiments, the electroless deposition process may be performed in an electroplating tool wherein, however, during the electroless deposition process, no current and/or voltage is applied to the semiconductor structure 100.

Figure 7:
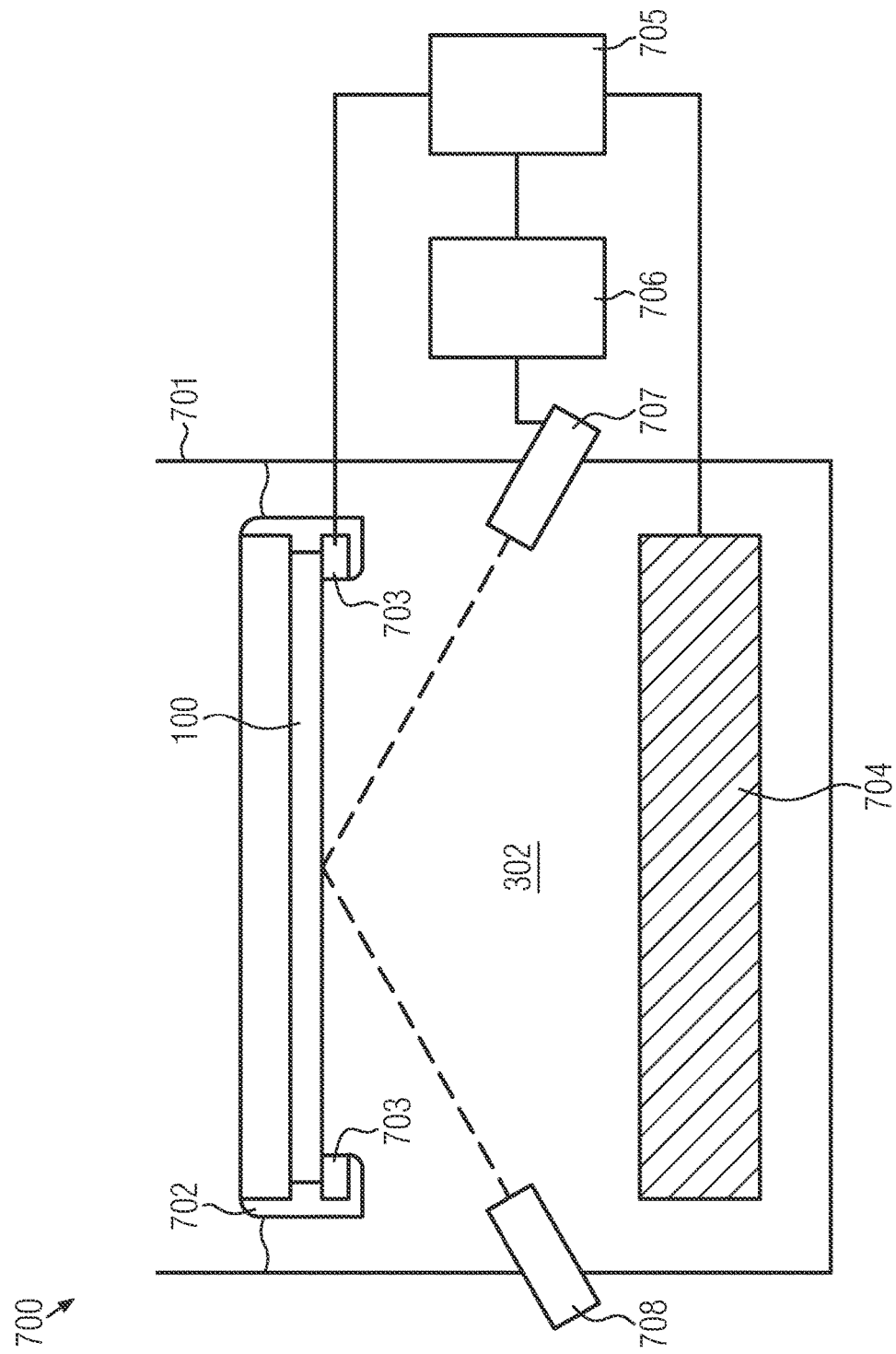
FIG. 7 shows a schematic cross-sectional view of an electroplating tool wherein an electroless deposition process may be performed in some embodiments.

FIG. 7 shows a schematic cross-sectional view of an electroplating tool 700 wherein the electroless deposition process may be performed in some embodiments. The electroplating tool 700 includes an electrolyte tank 701 and a semiconductor structure holder 702 that is adapted to hold the semiconductor structure 100. The semiconductor structure holder 702 may include a contact ring 703 for providing an electrical connection to the semiconductor structure 100. Additionally, the electroplating tool 700 may include an electrode 704, which may be formed of the second metal. In particular, in embodiments wherein the second metal includes copper, the electrode 704 may be a copper electrode.

The electroplating tool 700 may further include a power source 705 that is adapted to apply a voltage between the semiconductor structure 100 and the electrode 704 via the contact ring 703.

For performing the electroless deposition process, the semiconductor structure 100 may be inserted into the semiconductor structure holder 702, and the semiconductor structure holder 702 may be moved towards the electrolyte 302 in the electrolyte tank 701 for bringing the semiconductor structure 100 into contact with the electrolyte 302. During the electroless deposition process, the power source 705 may be switched off so that substantially no voltage and/or current is applied between the semiconductor structure 100 and the electrode 704.

Figure 4:
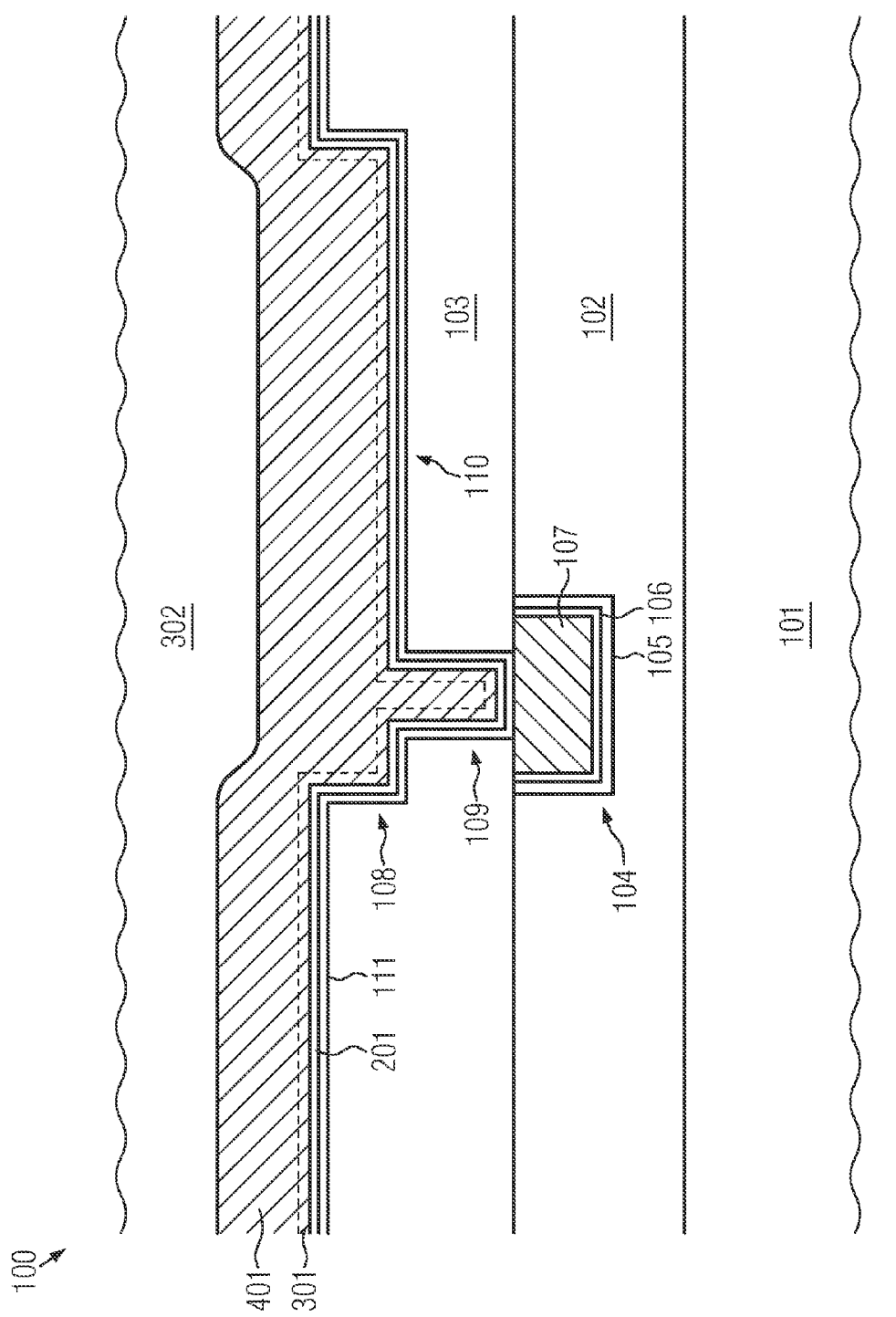

FIG. 4 shows a schematic cross-sectional view of the semiconductor structure 100 in a later stage of the manufacturing process. After the electroless deposition process, an electroplating process may be performed. In the electroplating process, a further layer 401 of the second metal may be deposited over the semiconductor structure 100. A composition of the layer 401 of second metal may be substantially the same as the composition of the layer 301 of second metal so that the layers 301, 401 form a substantially homogeneous second metal over the semiconductor structure 100. Therefore, in FIG. 4, the boundary between the layers 301, 401 is shown by a dashed line. A thickness of the layer 401 of second metal may be adapted such that the contact via 109 and the trench 110 are filled with the second metal after the electroplating process. In some embodiments, a thickness of the layer 401 of second metal may be in a range from a few nanometers to more than 10 μm, in particular in a range from about 500 nm to about 1.5 μm.

For performing the electroplating process, a current and/or a voltage may be applied between the semiconductor structure 100 and the electrode 704. A current density during the electroplating process may be in a range from about 1–50 mA/cm$^2$, in particular in a range from about 5-40 mA/cm$^2$.

By applying the current and/or voltage between the semiconductor structure 100 and the electrode 704, the electroless deposition process may be stopped so that no further first metal from the layer 201 of first metal is consumed. Stopping the electroless deposition process by applying current and/or voltage may be performed additionally or alternatively to the use of a dopant as described above.

The operation of the power source 705 may be controlled by a controller 706 (see FIG. 7). In some embodiments, the controller 706 may control a voltage applied by the power source 705. In other embodiments, the controller 706 may control a current applied by the power source 705.

In some embodiments, the controller 706 may be adapted to apply a voltage and/or a current between the semiconductor structure 100 and the electrode 704 for stopping the electroless deposition process and starting the electroplating process upon expiry of a predetermined time after bringing the semiconductor structure 100 into contact with the electrolyte 302. The predetermined time may be approximately a few seconds. In particular, the predetermined time may be in a range from about 0.5-30 seconds.

In other embodiments, a voltage and/or a current may be applied between the semiconductor structure 100 and the electrode for stopping the electroless deposition process and starting the electroplating process upon a detection of a change of a reflection of light from the semiconductor structure. For this purpose, the electroplating tool 700 may include a light detector 707 that is connected to the controller 706 and a light source 708. The formation of the layer 301 of second metal in the electroless deposition process may cause a change of the reflection of light from the semiconductor structure 100 since the first metal and the second metal may have different reflectivities. In particular, in embodiments wherein the first metal includes cobalt and the second metal includes copper, the deposition of the layer 301 of second metal in the electroless deposition process may be associated with a darkening of the semiconductor structure 100 so that a reduction of the amount of light reflected from the semiconductor structure 100 may be indicative of the formation of the layer 301 of second metal.

In the electroplating process that is performed after the electroless deposition process, the layer 301 of the second metal may serve as a seed layer for the deposition of the second metal of the layer 401. The layer 301 of second metal may reduce the electrical resistance, in particular in the initial phase of the electroplating process wherein substantially no or only a small amount of the second metal has been deposited by the electroplating process.

Performing the electroless deposition process wherein the layer 301 of second metal is formed and the electroplating process wherein the layer 401 of second metal is formed in the same electrolyte 302 and the same electroplating tool 700, as described above, may help ensure a formation of a substantially homogeneous second metal in the recess 108 formed by the trench 110 and the contact via 109, and it may help reduce time and costs of the manufacturing process since no separate tool and no movement of the semiconductor structure 100 between a tool employed for the electroless deposition process and a tool employed for the electroplating process needs to be performed.

However, the present disclosure is not limited to embodiments wherein the electroless deposition process and the electroplating process are performed by means of the same tool. In other embodiments, the electroless deposition process may be performed by bringing the semiconductor structure 100 into contact with a first electrolyte which may, for example, be provided in an electrolyte tank that need not be part of an electroplating tool. For stopping the electroless deposition process, in such embodiments, the semiconductor structure 100 may be removed from the electrolyte tank. Thereafter, the semiconductor structure 100 may be inserted into an electroplating tool wherein the electroplating process for depositing the layer 401 of second metal is performed.

The layer 201 of first metal, in particular in embodiments wherein the first metal includes cobalt, may be formed with a relatively high degree of compactness and conformity. Thus, when a portion of the layer 201 of first metal is replaced by the layer 301 of second metal in the electroless deposition process, a relatively high degree of compactness and conformity of the layer 301 of second metal that is used as seed layer in the electroplating process may be obtained. This may help substantially avoid or at least reduce a formation of voids in the trench 110 and/or the contact via 109. Furthermore, the portion of the layer 201 of first metal remaining in the semiconductor structure 100 may protect the diffusion barrier layer 111 so that a loss of diffusion barrier layer material may be substantially avoided or at least reduced.

Figure 5:
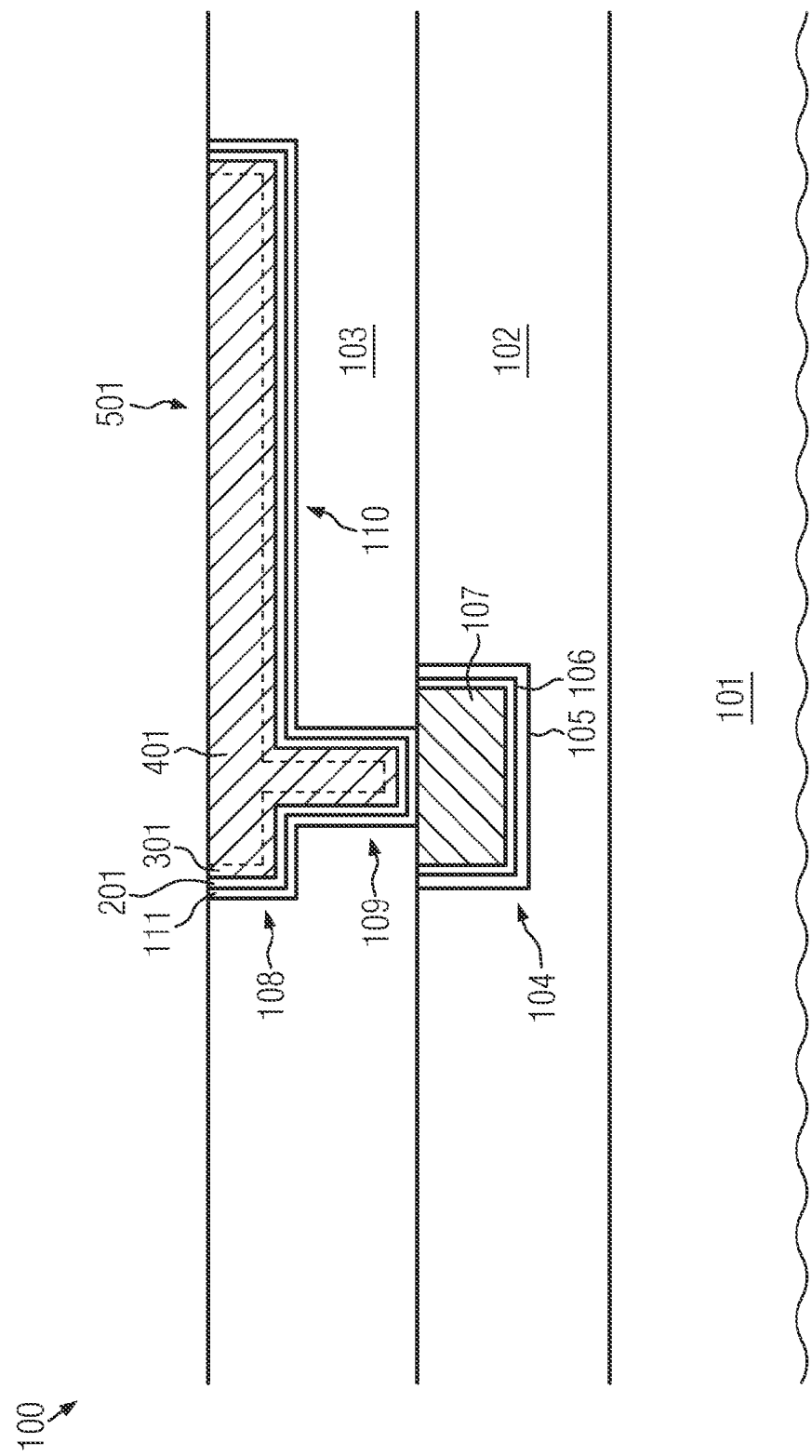

FIG. 5 shows a schematic cross-sectional view of the semiconductor structure 100 in a later stage of the manufacturing process. After the electroplating process wherein the layer 401 of second metal is formed, a chemical mechanical polishing process may be performed. The chemical mechanical polishing process may remove portions of the diffusion barrier layer 111, the portion of the layer 201 of second metal remaining in the semiconductor structure 100 and the layers 301, 401 of second metal outside the contact via 109 and the trench 110. The portions of the layers 301, 401 of second metal remaining in the semiconductor structure 100 after the chemical mechanical polishing process provide a second metal 501 that fills the trench 110 and the contact via 109 and provides an electrical connection in the semiconductor structure 100, wherein an electrical contact to the second metal 107 in the trench 104 is established by the portion of the second metal 501 in the contact via 109.

The portion of the layer 201 of first metal remaining in the semiconductor structure 100 is arranged between the diffusion barrier layer 111 and the second metal 501 in the trench 110 and the contact via 109, and it may help improve an adhesion between the diffusion barrier layer 111 and the second metal 501. In particular, an adhesion between cobalt and tantalum nitride, as well as an adhesion between cobalt and copper, may be greater than an adhesion between tantalum nitride and copper, so that a portion of the layer 201 including copper that remains in the semiconductor structure 100 in embodiments wherein the diffusion barrier layer 111 includes tantalum nitride and the second metal 501 includes copper may help improve the adhesion between the second metal 501 and the diffusion barrier layer 111.

After the chemical mechanical polishing process, further steps of a semiconductor manufacturing process may be performed, which may include a formation of a capping layer over the interlayer dielectric 103 and the second metal 501 in the recess 108 as well as a formation of further interconnect levels, wherein techniques as described above may be employed for filling contact vias and trenches that are formed in the higher interconnect levels.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is, therefore, evident that the particular embodiments disclosed above may be altered or modified and all such variations are considered within the scope and spirit of the invention. Accordingly, the protection sought herein is as set forth in the claims below.

What is claimed:

1. A method, comprising:
providing a semiconductor structure comprising a recess, said recess comprising at least one of a contact via and a trench;
depositing a layer of a first metal over said semiconductor structure, said layer of a first metal having a passivation layer comprising an oxide of said first metal disposed thereon;
performing an electroless deposition process, said electroless deposition process removing said passivation layer, removing a first portion of said layer of said first metal from said semiconductor structure, and depositing a first layer of a second metal over said semiconductor structure; and
performing an electroplating process, said electroplating process depositing a second layer of said second metal over said first layer of said second metal;
wherein a second portion of said layer of said first metal remains in said semiconductor structure.

2. The method of claim 1, further comprising bringing said semiconductor structure into contact with an electrolyte comprising ions of said second metal, said electroless deposition process being performed while said semiconductor structure is in contact with said electrolyte.

3. The method of claim 2, wherein said electroplating process is performed while said semiconductor structure is in contact with said electrolyte and wherein performing said electroplating process comprises applying at least one of a voltage and a current between said semiconductor structure and an electrode contacting said electrolyte.

4. The method of claim 3, wherein said at least one of a voltage and a current is applied between said semiconductor structure and said electrode upon expiry of a predetermined time after bringing said semiconductor structure into contact with said electrolyte.

5. The method of claim 3, wherein said at least one of a voltage and a current is applied between said semiconductor structure upon detection of a change of a reflection of light from said semiconductor structure.

6. The method of claim 3, wherein said electroless deposition process is stopped by applying said at least one of a voltage and a current between said semiconductor structure and said electrode.

7. The method of claim 3, wherein a redox potential of said first metal in said electrolyte is smaller than a redox potential of said second metal in said electrolyte.

8. The method of claim 7, wherein said first metal comprises cobalt and said second metal comprises at least one of copper, silver, gold, platinum and/or nickel.

9. The method of claim 8, wherein said first metal further comprises a dopant.

10. The method of claim 9, wherein said dopant comprises nitrogen.

11. The method of claim 9, wherein said deposition of said layer of first metal comprises forming a stop sublayer for said electroless deposition process in said layer of said first metal, a concentration of said dopant in said stop sublayer being greater than a concentration of said dopant in a portion of said layer of said first metal above said stop sublayer.

12. The method of claim 10, wherein said electrolyte comprises a solution of sulfuric acid and copper sulfate pentahydrate.

13. The method of claim 12, wherein said deposition of said layer of said first metal comprises performing at least one of a chemical vapor deposition process and an atomic layer deposition process.

14. The method of claim 13, wherein said deposition of said layer of said first metal comprises performing a substantially conformal chemical vapor deposition process.

15. The method of claim 13, further comprising, before depositing said layer of said first metal over said semiconductor structure, depositing a diffusion barrier layer over said semiconductor structure, said diffusion barrier layer being adapted to substantially prevent a diffusion of said second metal through said diffusion barrier layer.

16. The method of claim 15, wherein said diffusion barrier layer comprises tantalum nitride.

17. The method of claim 16, wherein said layer of said first metal has a thickness in at least one of a range from about 1-100 nm and a range from about 5-40 nm.

18. The method of claim 13, wherein said deposition of said layer of said first metal comprises a chemical vapor deposition process, and wherein:
 a flow of a process gas comprising a precursor and a carrier gas is in a range from about 50-4000 sccm;
 a deposition temperature is in a range from about 100-300° C.; and
 a pressure of said process gas is in a range from about 2-40 Torr.

19. The method of claim 14, wherein:
 a flow of a process gas comprising a precursor and a carrier gas is in a range from about 300-1000 sccm;
 a deposition temperature is in a range from about 125-225° C.; and
 a pressure of said process gas is in a range from about 5-15 Torr.

20. A method, comprising:
 providing a semiconductor structure comprising a recess, said recess comprising at least one of a contact via and a trench;
 depositing a layer of cobalt over said semiconductor structure, said layer of cobalt having a passivation layer comprising cobalt oxide disposed thereon;
 performing an electroless deposition process in the presence of an electrolyte comprising ions of said second metal, said electroless deposition process removing said passivation layer, removing a first portion of said layer of cobalt from said semiconductor structure, and depositing a first layer of a second metal over said semiconductor structure, wherein a redox potential of cobalt in said electrolyte is smaller than a redox potential of said second metal in said electrolyte; and
 performing an electroplating process, said electroplating process depositing a second layer of said second metal over said first layer of said second metal;
 wherein a second portion of said layer of said first metal remains in said semiconductor structure.

21. The method of claim 20, wherein said second metal comprises at least one of copper, silver, gold, platinum and/or nickel.

22. The method of claim 20, wherein said layer of cobalt further comprises a dopant.

23. The method of claim 22, wherein said dopant comprises nitrogen.

24. The method of claim 22, wherein said deposition of said layer of cobalt comprises forming a stop sublayer for said electroless deposition process in said layer of cobalt using said dopant, a concentration of said dopant in said stop sublayer being greater than a concentration of said dopant in a portion of said layer of cobalt above said stop sublayer.

* * * * *